(12) United States Patent
Zhang et al.

(10) Patent No.: US 12,389,781 B2
(45) Date of Patent: Aug. 12, 2025

(54) OLED DISPLAY DEVICE AND PREPARATION METHOD THEREOF

(71) Applicant: BOE Technology Group Co., Ltd., Beijing (CN)

(72) Inventors: Ziyu Zhang, Beijing (CN); Jia Zhao, Beijing (CN); Pinfan Wang, Beijing (CN); Haoran Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 109 days.

(21) Appl. No.: 17/801,803

(22) PCT Filed: Nov. 19, 2021

(86) PCT No.: PCT/CN2021/131592
§ 371 (c)(1),
(2) Date: Nov. 3, 2022

(87) PCT Pub. No.: WO2022/227510
PCT Pub. Date: Nov. 3, 2022

(65) Prior Publication Data
US 2024/0215392 A1    Jun. 27, 2024

(30) Foreign Application Priority Data
Apr. 29, 2021    (CN) .......................... 202110476532.2

(51) Int. Cl.
*H10K 59/80*    (2023.01)
*H10K 71/00*    (2023.01)
*H10K 102/00*    (2023.01)

(52) U.S. Cl.
CPC ......... *H10K 59/873* (2023.02); *H10K 71/851* (2023.02); *H10K 2102/311* (2023.02)

(58) Field of Classification Search
None
See application file for complete search history.

(56) References Cited

U.S. PATENT DOCUMENTS

2016/0118451 A1    4/2016    Youn et al.
2018/0364846 A1*   12/2018   Ahn ...................... G06F 3/0412
2022/0149084 A1    5/2022    Liu et al.

FOREIGN PATENT DOCUMENTS

CN    111584586 A    8/2020
CN    112271196 A    1/2021
(Continued)

OTHER PUBLICATIONS

International Search Report for PCT/CN2021/131592 Mailed Feb. 17, 2022.

*Primary Examiner* — Kyoung Lee
(74) *Attorney, Agent, or Firm* — Ling Wu; Stephen Yang; Ling and Yang Intellectual Property (57) ABSTRACT

An OLED display device and a preparation method thereof are provided. The OLED display device includes a flat region and a bent region around the flat region; the bent region is bent toward a backlight side of the flat region, and the bent region includes at least one stretching region; the stretching region comprises a display region and a first etching region, the first etching region is located at an edge of the display region away from the flat region and is connected with at least part the edge of the display region at the side away from the flat region; the display region includes at least one opening, and a boundary of the first etching region and the display region bypasses the opening; the display region includes a first display film layer, and the first etching region is a region where the first display film layer is etched away.

18 Claims, 5 Drawing Sheets

(56) References Cited

FOREIGN PATENT DOCUMENTS

| CN | 112366209 A | 2/2021 |
|---|---|---|
| CN | 113206137 A | 8/2021 |

\* cited by examiner

Direction parallel to OLED device →

FIG. 9

OLED DISPLAY DEVICE AND PREPARATION METHOD THEREOF

CROSS-REFERENCE TO RELATED APPLICATIONS

The present application is a U.S. National Phase Entry of International Application No. PCT/CN2021/131592 having an international filing date of Nov. 19, 2021, which claims priority to Chinese patent application No. 202110476532.2, entitled "OLED Display Device and Preparation Method Thereof", filed to the CNIPA on Apr. 29, 2021. The above-identified applications are incorporated into the present application by reference in their entireties.

TECHNICAL FIELD

Embodiments of the present disclosure relate to, but are not limited to, the field of display technology, in particular to an OLED display device and a preparation method thereof.

BACKGROUND

An Organic Light Emitting Diode (OLED) is an active light-emitting display device, which has advantages such as self-luminescence, wide view angle, high contrast, low power consumption, wide color gamut, thinness and ability of being specially shaped. With continuous development of display technology, the OLED technology is increasingly applied in flexible display and transparent display. The transparent display is an important branch of display technologies, and refers to displaying images in a transparent state, wherein a viewer can see not only images in a display device, but also scenes behind the display device, thus Virtual Reality (VR)/Augmented Reality (AR) and 3D display functions can be implemented.

In mobile phones and other terminal devices, in order to increase the screen-to body ratio, an OLED display device with four curved surfaces is often employed, and the four corner regions of the OLED display device are bent. By opening holes in the OLED display device, the OLED display device is enabled to form a stretchable (compressible) structure, such that when the OLED display device is attached to the 3D cover plate, it is stretched (compressed) to achieve the effect of integrated display. However, when the OLED display device is bent, the edge of the OLED display device will be wrinkled or cracked, which will affect the display effect of the bent region.

SUMMARY

The following is a summary of subject matters described herein in detail. The summary is not intended to limit the protection scope of claims.

In a first aspect, an embodiment of the present disclosure provides an OLED display device including a flat region and a bent region around the flat region; the bent region is bent toward a backlight side of the flat region, and the bent region includes at least one stretching region; the stretching region includes a display region and a first etching region, the first etching region is located at an edge of the display region at a side away from the flat region, the first etching region is connected with at least a part of the edge of the display region at the side away from the flat region; the display region includes at least one opening, and a boundary of the first etching region and the display region bypasses the opening; the display region includes a first display film layer, and the first etching region is a region where the first display film layer is etched away.

In an exemplary implementation, a boundary of the first etching region and the display region includes a plurality of concave portions and a plurality of convex portions arranged alternately.

In an exemplary implementation, the display region includes at least two openings, wherein the concave portion bypasses the opening, and the convex portion is positioned between adjacent openings.

In an exemplary implementation, the at least two openings include at least two first slits, which extend along a first direction and are arranged at intervals along a second direction, and the first direction is different from the second direction, the concave portion bypasses ends of the at least two first slits, and the convex portion is located between the adjacent at least two first slits.

In an exemplary implementation, the display region includes at least three openings, including at least two first slits and at least one second slit, wherein the at least two first slits extend along a first direction and are arranged at intervals along a second direction, the at least one second slit extends along the second direction, and the first direction is different from the second direction, the at least one second slit is located between the adjacent at least two first slits and at least one groove is formed by the at least one second slit in combination with the at least two first slits, the concave portions bypass ends of the at least two first slits, and the convex portions are located in the at least one groove.

In an exemplary implementation, a minimum distance between the boundary and an edge of the opening is equal to a minimum distance between edges of adjacent openings.

In an exemplary implementation, the corners of the concave portion and/or the convex portions are rounded corners.

In an exemplary implementation, the radius of the rounded corner equals to 3 to 10 times the width of the opening.

In an exemplary implementation, the opening is a rectangle with rounded corners.

In an exemplary implementation, in a direction perpendicular to the OLED display device, the first etching region includes a functional structure film layer that wraps an edge of the first display film layer.

In an exemplary implementation, the functional structure film layer includes a first functional film layer and a second functional film layer disposed oppositely, and a connection layer disposed between the first functional film layer and the second functional film layer, which wraps an edge of the first display film layer.

In an exemplary implementation, at a direction perpendicular to the OLED display device, the first display film layer includes a base substrate, the base substrate includes a first flexible substrate layer, a first buffer layer, a second flexible substrate layer and a second buffer layer, which are stacked, wherein the first flexible substrate layer and the second flexible substrate layer are made of organic material, the first buffer layer and the second buffer layer are made of inorganic material, and edges of the first flexible substrate layer and the second flexible substrate layer at a side close to the first etching region are recessed along a direction away from the first etching region.

In an exemplary implementation, the etching region is connected with the entire edge of the display region at the side away from the flat region.

In an exemplary implementation, the bent region further includes at least one frame region connected with the stretching region, at least part of an edge of the frame region at the side away from the flat region is provided with a second etching region. In the direction perpendicular to the OLED display device, the frame region includes a second display film layer, and the second etching region is a region where the second display film layer is etched away.

In a second aspect, an embodiment of the present disclosure provides a method preparation method of an OLED display substrate, including:

forming a flat region and a bent region around the flat region; wherein, the bent region is bent toward a backlight side of the flat region, and the bent region includes at least one stretching region; the stretching region includes a display region and a first etching region, the first etching region is located at an edge of the display region at a side away from the flat region, the first etching region is connected with at least a part of the edge of the display region at the side away from the flat region; the display region includes at least one opening, and a boundary of the first etching region and the display region bypasses the opening; the display region includes a first display film layer, and the first etching region is a region where the first display film layer is etched away.

In an exemplary embodiment, the first etching region and the opening are prepared by a same etching process.

In an exemplary embodiment, the boundary between the first etching region and the display region is formed with a plurality of concave portions and a plurality of convex portions arranged alternately.

In an exemplary embodiment, the display region is formed with at least two openings in such a way that the concave portion bypasses the openings, and the convex portion is positioned between adjacent openings.

Other aspects may be understood upon reading and understanding the drawings and the detailed description.

DETAILED DESCRIPTION

The embodiments of the present disclosure will be described in detail below with reference to the drawings. It is to be noted that implementation modes may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the specification, for convenience, wordings indicating directional or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the constituent elements. Therefore, appropriate replacements can be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations.

In the present disclosure, "about" refers to that a boundary is defined not so strictly and numerical values within process and measurement error ranges are allowed.

The manufacturing of OLED display devices is mainly divided into three major processes: Array Process, Organic Film Forming Process (OLED) and Module Process. In Array Process, generally, a flexible base substrate is formed through a PI coating process on a glass base substrate, and then films of different patterns and different materials are repeatedly overlapped on the flexible base substrate through filming, exposure, etching processes and the like to form a drive structure layer, such as LTPS (Low Temperature Polysilicon) semiconductor thin film transistor drive circuit.

In Organic Film Forming Process, generally, an organic luminescent material and a cathode material and the like are evaporated on the drive structure layer to form a luminescent structure layer through vacuum evaporation, and then packaged in an environment without oxygen.

Module Process mainly includes module procedure. In the module procedure, generally, a display motherboard is processed with laser striping and support film attachment, and then cut according to different product models, a full module product is formed through processes such as panel test, polarizer attachment, chip (IC) binding, flexible printed circuit board (FPC) binding and cover plate attachment, which is finally packaged and warehoused after module test.

Figure 1:
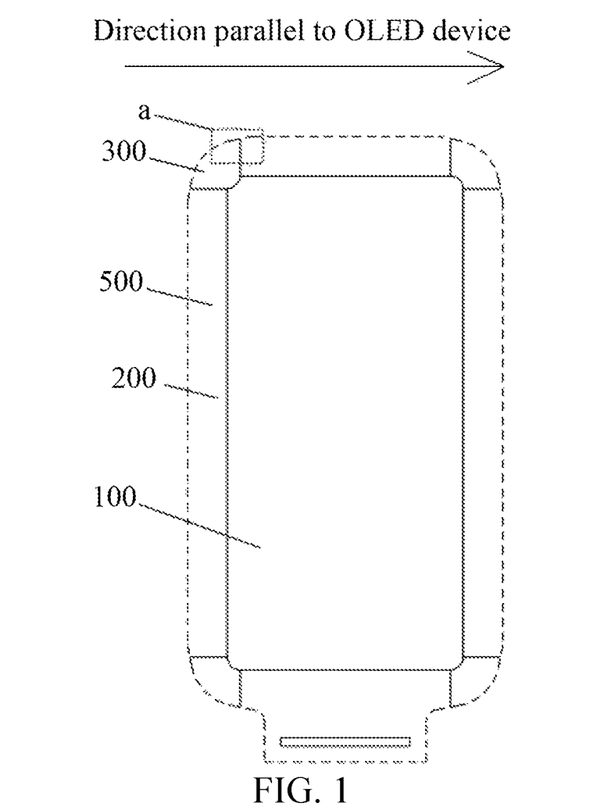
FIG. 1 is a schematic diagram of a structure of an OLED display device.
Figure 2:
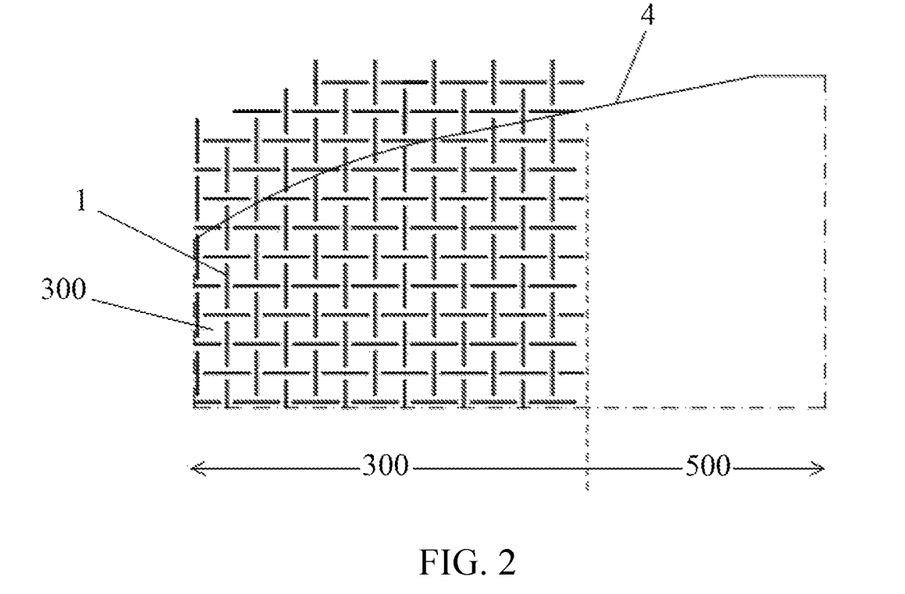
FIG. 2 is an enlarged view of an OLED display device before cutting.

FIG. 1 is a schematic diagram of a structure of an OLED display device. FIG. 2 is an enlarged view of an OLED display device before cutting. Illustration is made by taking a case that FIG. 2 is an enlarged view of the OLED display device in FIG. 1 before cutting as an example. As shown in FIG. 1 and FIG. 2, in a direction parallel to the OLED display device, the OLED display device includes a flat region 100 and a bent region 200 around the flat region 100 that is bent toward a backlight side of the flat region 100, and the bent region 200 includes at least one stretching region 300 and a frame region 500 connected with the stretching region 300. Taking a rectangular OLED display device as an example, the bent region 200 is a rectangular ring with rounded corners and is arranged around a periphery of the flat region 100. The bent region 200 includes four stretching regions 300 located at four corner positions of the bent region 200 respectively, and four frame regions 500 located at four edge positions of the bent region 200 respectively, and the stretching regions 300 is connected with two adjacent frame regions 500 respectively. The stretching region 300 includes at least one opening 1. The opening 1 can leave a light channel for devices such as an under-screen light probe and an under-screen camera, and can also be used to provide a deformation space during stretching, improve the flexibility of the display screen and realize the stretchable display screen. In the module procedure, the edge of the stretching region 300 forms a cutting line 4 before cutting is performed for the OLED display device. When cutting is performed, a laser performs cutting along the cutting line 4. However, the cutting line 4 cannot bypass the opening 1 due to limitations such as laser cutting accuracy tolerance, heat affected region of laser cutting, and production rhythm. The stretching region 300 needs to be extended outward to the outside of the cutting line 4, i.e. the opening 1 on the stretching region 300 needs to be extended outward to the peripheral region of the OLED display device. The cutting line 4 cuts directly without considering the pattern of opening 1. Due to the large heat affected region of laser cutting, it is readily to form cracks at the fragile edge of the opening 1, resulting in failure. In addition, such cutting method will cut the opening 1 in the middle and form many open-shaped openings 1, which will cause the opening 1 to be overstretched and produce significant stress concentration at the edge of the stretching region 300, thus causing structure damage and destroying the reliability of the device.

An embodiment of the present disclosure provides a flat region and a bent region around the flat region; wherein, the bent region is bent toward a backlight side of the flat region, and the bent region includes at least one stretching region; the stretching region includes a display region and a first etching region, the first etching region is located at an edge of the display region at a side away from the flat region, the first etching region is connected with at least a part of the edge of the display region at the side away from the flat region; the display region includes at least one opening, and a boundary of the first etching region and the display region bypasses the opening; the display region includes a first display film layer, and the first etching region is a region where the first display film layer is etched away.

In the OLED display device according to an embodiment of the present disclosure, a first etching region is formed such that a boundary between the first etching region and the display region bypasses the opening, so as to ensure the integrity of the opening and improve the stretching performance and reliability of the OLED display device.

Figure 3:
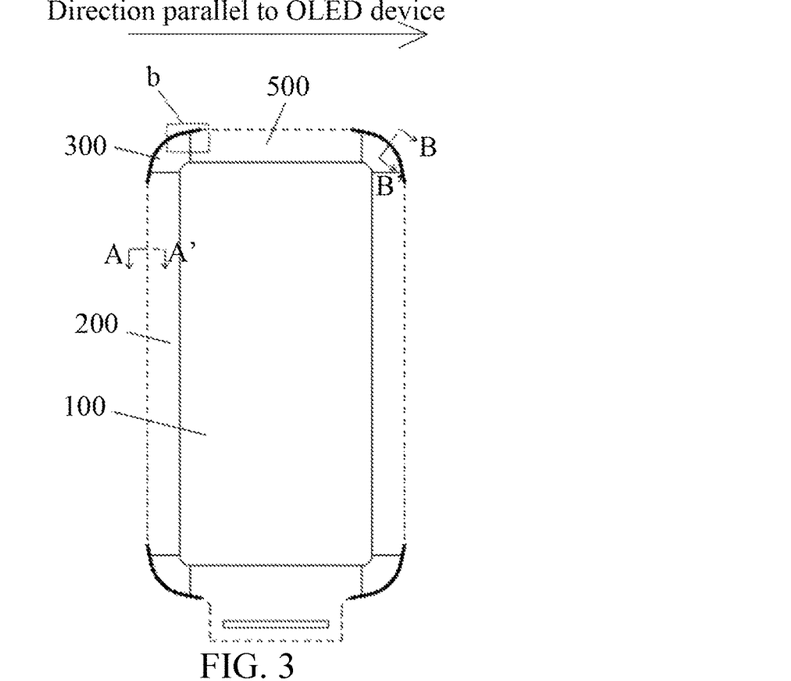
FIG. 3 is a first schematic diagram of a structure of an OLED display device according to an embodiment of the present disclosure.
Figure 4:
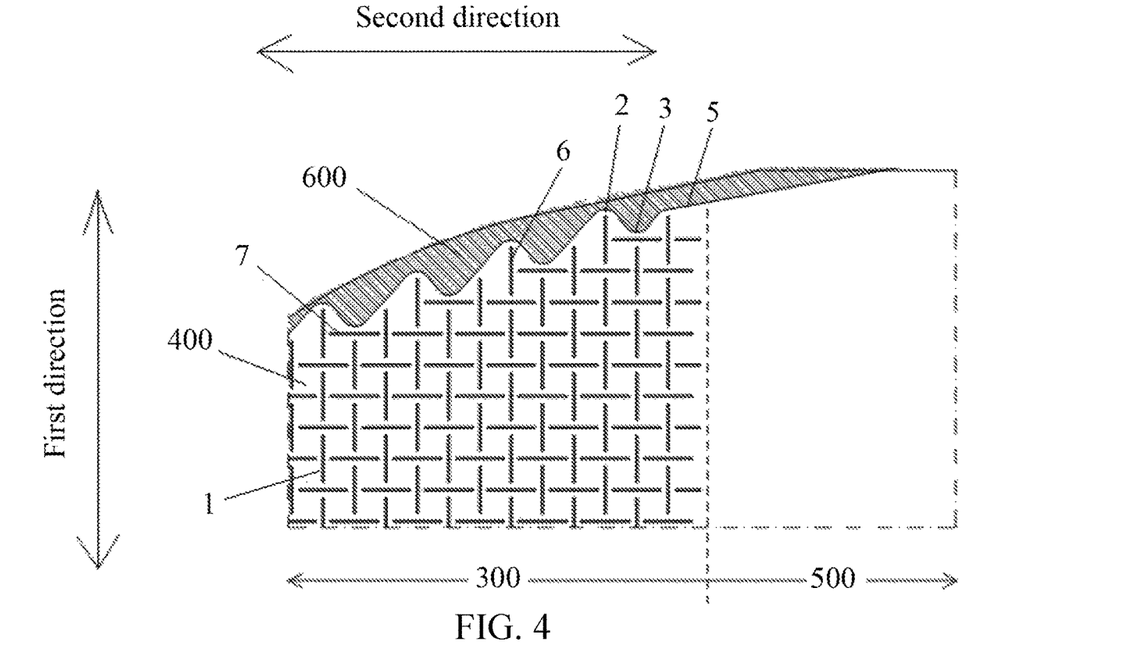
FIG. 4 is a first enlarged view of an OLED display device according to an embodiment of the present disclosure.
Figure 5:
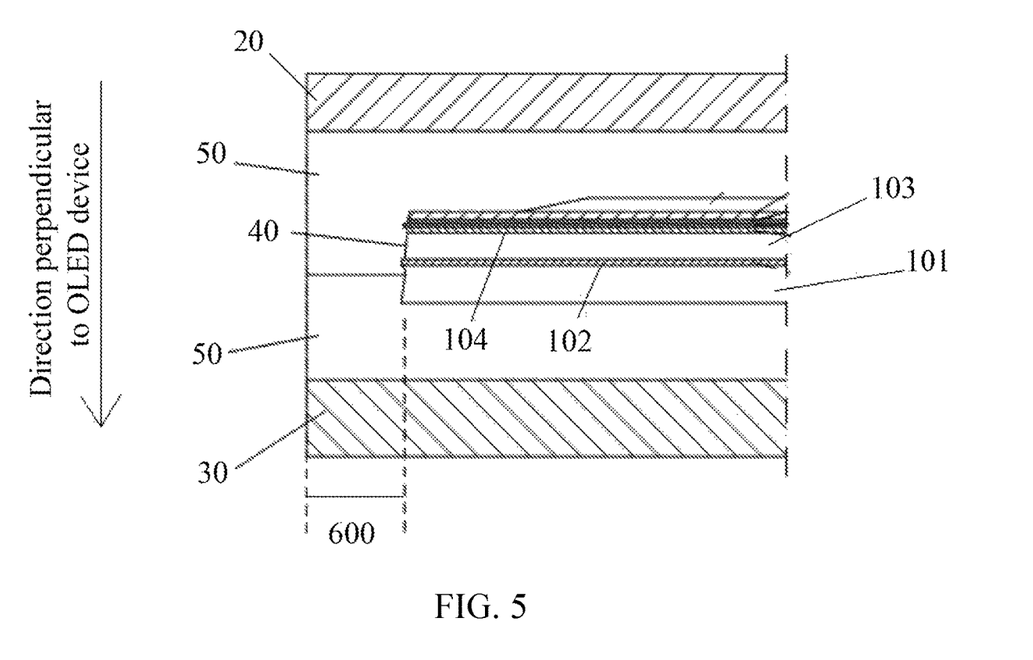
FIG. 5 is a cross-sectional view of a stretching region in an OLED display device according to an embodiment of the present disclosure.

FIG. 3 is a first schematic diagram of a structure of an OLED display device according to an embodiment of the present disclosure. FIG. 4 is a first enlarged view of an OLED display device according to an embodiment of the present disclosure. FIG. 5 is a cross-sectional view of a stretching region in an OLED display device according to an embodiment of the present disclosure. FIG. 4 is regarded as an enlarged view for a position at b of the OLED display device in FIG. 3 and illustration is made by taking a case that FIG. 5 is a cross-sectional view of the OLED display device in FIG. 3 taken along the B-B direction as an example. As shown in FIG. 3, FIG. 4 and FIG. 5, in a direction parallel to the OLED display device, the OLED display device according to an embodiment of the present disclosure includes a flat region 100 and a bent region 200 around the flat region 100, wherein the bent region 200 is bent toward a backlight side of the flat region 100. The light-transmitting side of the flat region 100 is a display side and the backlight side of the flat region 100 refers to a side away from the display side of the flat region 100. The bent region 200 includes at least one stretching region 300. Taking a rectangular OLED display device with rounded corners as an example, the bent region 200 is a rectangular ring with rounded corners and is arranged around the periphery of the flat region 100. The bent region 200 includes four stretching regions 300 located at four corner positions of the bent region 200 respectively. The stretching region 300 includes a display region 400 connected with the flat region 100 and a first etching region 600 connected with at least a part of an edge of the display region 400 at a side away from the flat region 100. The first etching region 600 is located at the edge of the stretching region 300. The display region 400 includes at least one opening 1. The opening 1 can leave a light channel for devices such as an under-screen light probe, an under-screen camera and the like, and can also be used to provide a deformation space during stretching, improve the flexibility of the display screen and realize a stretchable display screen. The boundary 5 between the first etching region 600 and the display region 400 bypasses the opening 1, such that the boundary 5 between the first etching region 600 and the display region 400 is spaced from the edge of the opening 1.

In a direction perpendicular to the OLED display device, the display region 400 includes a first display film layer 40, the first display film layer 40 includes a base substrate and a plurality of structure film layers stacked on the base substrate, wherein the first display film layer 40 is used for light emitting. The first etching region 600 is a region where the first display film layer 40 is etched away. In the module procedure, when cutting is performed for the OLED display device, the laser performs cutting along the edge of the first etching region 600 at the side away from the display region 400, and the first etching region 600 separates the laser from the opening 1 to avoid laser cutting the opening 1, thereby ensuring the integrity of the opening 1 and improving the stretching performance and reliability of the OLED display device.

In an exemplary embodiment, the planar structure of the first display film layer 40 includes a plurality of island regions distributed in an array and spaced apart from each other, openings 1 located between adjacent island regions, and bridge regions connecting the adjacent island regions to each other, wherein the island region is used for image display, the opening 1 is used for providing a deformation space during stretching and forming holes for transmitting light, and the bridge region is used for routing and transferring a tension force. Each island region may include one or more pixel units, and each pixel unit includes three (e.g. red, green and blue) or four (e.g. red, green, blue and white) light emitting units for emitting different colors.

In an exemplary embodiment, the opening 1 is a micro-groove or a micro-hole penetrating the OLED display device, and the opening 1 is a rectangle with rounded corners, such that the opening 1 has good stretching performance and the opening 1 is prevented from cracking during stretching; the width-to-length ratio of opening 1 is 1:10 to 1:30, for example, the opening 1 is 15 um in width and 300 um in length.

In an exemplary embodiment, a plurality of openings 1 are arranged at intervals and may be combined to form various shapes such as an I-shape, a T-shape or the like.

In an exemplary embodiment, as shown in FIG. 4, the boundary 5 between the first etching region 600 and the display region 400 includes a plurality of concave portions 2 and a plurality of convex portions 3 arranged alternately. The plurality of concave portions 2 and the plurality of convex portions 3 are combined to form a wavy shape, and the plurality of concave portions 2 and a plurality of convex portions 3 extend along directions of the edges of the openings 1, such that the distances from the boundary 5 between the first etching region 600 and the display region 400 to the edges of the openings 1 is uniform, therefore, a force is uniformly applied to the edges of the openings 1, and the openings 1 are prevented from cracking when stretched.

In an exemplary embodiment, as shown in FIG. 4, the display region 400 includes at least two openings 1, the concave portions 2 bypass the ends of the openings 1, and the convex portions 3 are positioned between adjacent openings 1, such that the distances between the boundary 5 and the edges of the openings 1 are the same or similar, such that a force is uniformly applied to the edges of the openings 1, and the openings 1 are prevented from cracking when stretched.

In an exemplary embodiment, as shown in FIG. 4, the display region 400 includes at least two openings 1, the at least two openings 1 includes at least two first slits 6, which are strip-shaped slits, wherein the at least two first slits 6 extend along a first direction and are arranged at intervals along a second direction to form a first slit row, a plurality of first slit rows may be arranged along the first direction, and the first slits 6 in adjacent first slit rows are staggered with each other. The concave portions 2 bypass the ends of the first slits 6 in the at least one first slit row, and the convex portions 3 are located between adjacent first slits 6 in the at least one first slit row. Herein, the first direction is different from the second direction. As an example, the OLED display device according to an embodiment of the present disclosure is a cuboid with rounded corners, the first direction is the long side direction of the OLED display device, the second direction is the short side direction of the OLED display device, and the first direction is perpendicular to the second direction.

In an exemplary embodiment, as shown in FIG. 4, the display region 400 includes at least three openings 1 including at least two first slits 6 and at least one second slit 7, which are both strip-shaped slits, wherein the at least two first slits 6 extend along the first direction and are arranged at intervals along the second direction to form a first slit row, a plurality of first slit rows may be arranged along the first direction, and the first slits 6 in adjacent first slit rows are staggered with each other. The at least one second slit 7 extends along a second direction, and is located between adjacent first slits 6 in the first slit row and forms at least one groove in combination with adjacent first slits 6 in the first slit row. The concave portions 2 bypass the ends of the first slits 6 in the at least one first slit row, and the convex portion 3 is located in the at least one groove. Herein, the first direction is different from the second direction. As an example, the OLED display device according to an embodiment of the present disclosure is a cuboid with rounded corners, the first direction is the long side direction of the OLED display device, the second direction is the short side direction of the OLED display device, and the first direction is perpendicular to the second direction.

In an exemplary embodiment, the shapes of the convex portions 3 and the concave portions 2 are not limited as long as the distances from the boundary 5 between the first etching region 600 and the display region 400 to the edges of the openings 1 are the same or similar. For example, the convex portions 3 and the concave portions 2 are arc-shaped or polygonal.

In an exemplary embodiment, a minimum distance from the boundary 5 between the first etching region 600 and the display region 400 to the edges of the openings 1 is equal to a minimum distance between the edges of the adjacent openings 1, such that a force is uniformly applied to the edges of the openings 1 and the openings 1 are prevented from cracking when stretched.

In an exemplary embodiment, the corners of the convex portions 3 and/or the concave portions 2 are rounded corners. The opening 1 is a rectangle with rounded corners. The radius at the corner of the convex portion 3 and/or the concave portion 2 equals to 3 to 10 times the width of the opening. The rounded corners can facilitate a force to be uniformly applied at the corners of the convex portions 3 and/or the concave portions 2, thus avoiding stress concentration at the corners, which will result in cracking of the adjacent openings 1.

As shown in FIG. 5, in a direction perpendicular to the OLED display device, the island region of the first display film layer 40 includes a base substrate, a drive structure layer and a light emitting structure layer, which are stacked on the base substrate, wherein the drive structure layer mainly includes a pixel driving circuit composed of a plurality of Thin Film Transistors (TFT), and the light emitting structure layer mainly includes an anode, an organic light emitting layer, and a cathode. The bridge region of the first display film layer 40 mainly includes a connection line and a structure layer covering the connection line, wherein the connection line is used to realize signal communication between adjacent island regions and the structure layer is used for transferring a tension force. The opening of the first display film layer 40 includes a plurality of micro-grooves or micro-holes, the structure film layer and the base substrate in each of the micro-grooves or micro-holes are removed for providing a deformation space during stretching, and the plurality of holes enable light to directly pass through, thus realizing a transparent display structure having certain stretchability according to the embodiments of the present disclosure.

In an exemplary embodiment, the base substrate in the first display film layer 40 may be a flexible substrate and the base substrate may adopt a single-layer structure or a double-layer structure. Take the double-layer structure of the base substrate as an example. The base substrate includes a first flexible substrate layer 101, a first buffer layer 102, a second flexible substrate layer 103, and a second buffer layer 104 which are stacked in sequence. The preparation process of the base substrate 10 includes: a flexible material is coated on a glass carrier plate, which is then cured to form a film so as to form a first flexible substrate layer 101, a buffer film is deposited on the first flexible substrate layer 101 to form a pattern of the first buffer layer 102, a flexible material is coated on the first buffer layer 102, which is then cured to form a film so as to form a second flexible substrate layer 103, and a buffer film is deposited on the second flexible substrate layer 103 to form a second buffer layer 104. The first buffer layer 102 is used for absorbing energy during subsequent laser striping. The second buffer layer 104 is used for sealing. Both the first buffer layer 102 and the second buffer layer 104 at the opening 1 are etched away. The first flexible substrate layer 101 and the second flexible substrate layer 103 may be made of organic materials such as polyimide (PI), polyethylene terephthalate (PET), and flexible polymer films subjected to surface treatment. The materials of the first buffer layer 102 and the second buffer layer 104 may be inorganic.

In the direction perpendicular to the OLED display device, the first etching region 600 is a region where the first display film layer 40 is etched away, including etching away the structure film layer and the base substrate of the first display film layer 40. The structure film layer of the first display film layer 40 includes a film layer of the island region and a film layer of the bridge region. The first etching region 600 and the opening 1 can be prepared by the same etching process. For example, when the structure film layer and the base substrate of the first display film layer 40 are formed, the structure film layer and the base substrate at the opening 1 and the first etching region 600 are etched away through a photolithography process.

In an exemplary embodiment, since the etch selectivities of inorganic materials and organic materials in the base substrate of the first display film 40 are different, after the first etching region 600 is formed by photolithography, the edges of the first flexible substrate layer 101 and the second flexible substrate layer 103 in the base substrate of the first display film 40 close to the first etching region 600 are recessed along a direction away from the first etching region 600. In the OLED display device according to an embodiment of the present disclosure, the first etching region 600 is formed at first to bypass the opening 1, then a laser cutting is performed along the edge of the first etching region 600 so as to avoid direct laser cutting for the first display film layer 40, thereby eliminating damage to the opening 1 caused by laser cutting. The first etching region 600 is formed through the photolithography process, such that the edge of the first display film 40 close to the first etching region 600 is smoother.

In an exemplary embodiment, as shown in FIG. 5, in the direction perpendicular to the OLED display device, the first etch region 600 includes a functional structure film layer that wraps the edge of the first display film layer to protect the first display film layer.

In an exemplary embodiment, as shown in FIG. 5, the functional structure film layer includes a first functional film layer 20 and a second functional film layer 30 provided oppositely, and a connection layer 50 provided between the first functional film layer 20 and the second functional film layer 30, and the connection layer 50 wraps the edge of the first display film layer 40 to protect the first display film layer. The first functional film layer 20 may include a film structure such as a polarizer, the second functional film layer 30 may include a film structure such as a heat dissipation film and a support film, and the connection layer 50 may be an adhesive layer.

In an exemplary embodiment, the first etching region may be connected with partial edge of the display region at a side away from the flat region, thereby ensuring the integrity of the opening at the partial edge of the display region. Alternatively, the first etching region may be connected with the entire edge of the display region at the side away from the flat region, thereby ensuring the integrity of the opening at the entire edge of the display region. Alternatively, the first etching region may be connected with the entire edge of the display region at the side away from the flat region and extended outward to a frame region connected with the display region, thereby ensuring the integrity of the opening at the edge of the entire display region. Alternatively, the first etching region may be connected with the entire edge of the display region at the side away from the flat region, the edge of the frame region at a side away from the flat region is provided with a second etching region, the second etching region is connected with the entire edge of the frame region at the side away from the flat region, and the first etching region and the second etching region are connected end to end to form an annular region around the perimeter of the bent region.

Figure 6:
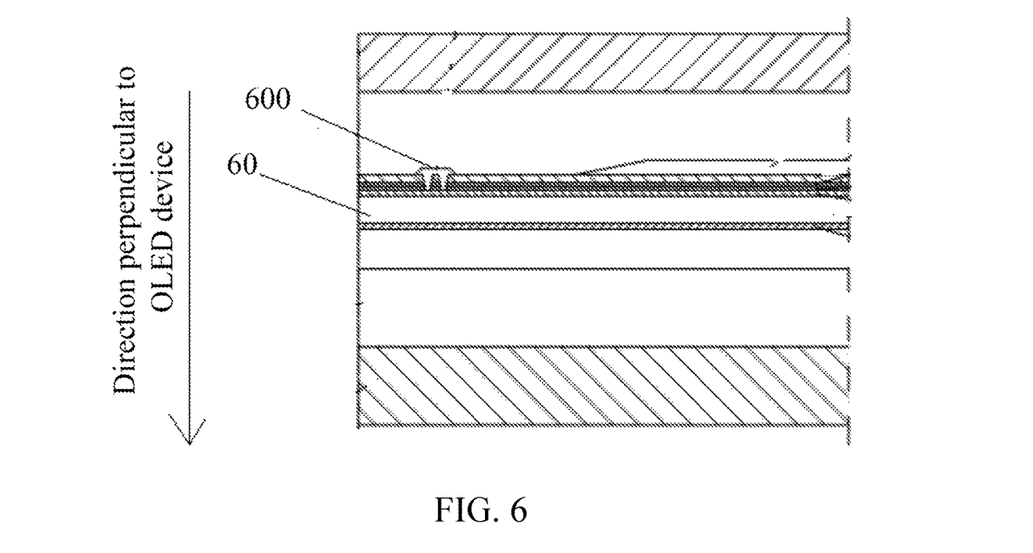
FIG. 6 is a cross-sectional view of a frame region in an OLED display device according to an embodiment of the present disclosure.

FIG. 6 is a cross-sectional view of a frame region in an OLED display device according to an embodiment of the present disclosure. Illustration is made by taking a case that FIG. 6 is a cross-sectional view of the OLED display device in FIG. 3 taken along an A-A direction as an example. As shown in FIG. 3 and FIG. 6, the bent region 200 further includes at least one frame region 500 connected with the stretching region 300. Taking a rectangular OLED display device with rounded corners as an example, the bent region 200 is a rectangular ring with rounded corners and is arranged around the periphery of the flat region 100. The bent region 200 includes four stretching regions 300 located at four corner positions of the bent region 200 respectively, and four frame regions 500 located at four edge positions of the bent region 200 respectively, and the stretching regions 300 is connected with two adjacent frame regions 500 respectively. In the direction perpendicular to the OLED display device, the frame region 500 includes a second display film layer 60, the body structure of the second display film layer 60 is substantially the same as that of the first display film layer 40, except that an isolation structure 601 is provided on a base substrate of the second display film layer 60, and the isolation structure 601 is located at an edge of the second display film layer 60 for isolating a packaging material.

Figure 7:
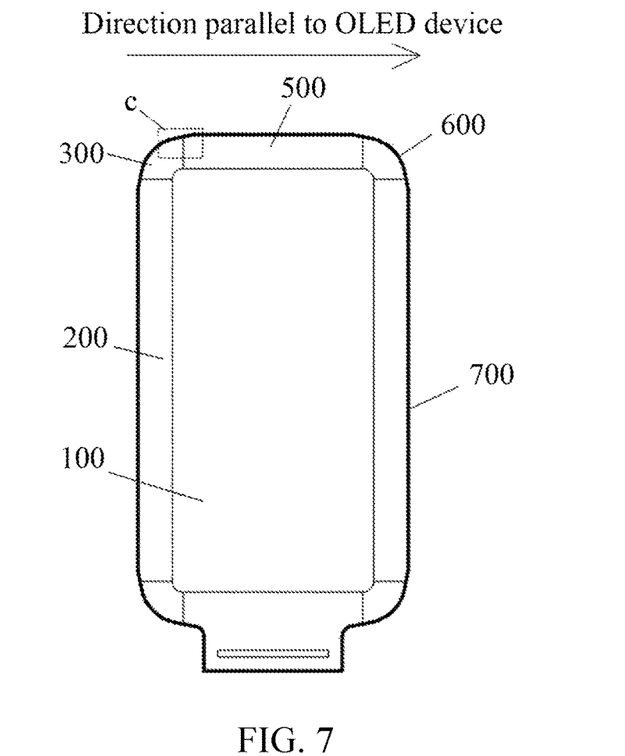
FIG. 7 is a second schematic diagram of a structure of an OLED display device according to an embodiment of the present disclosure.
Figure 8:
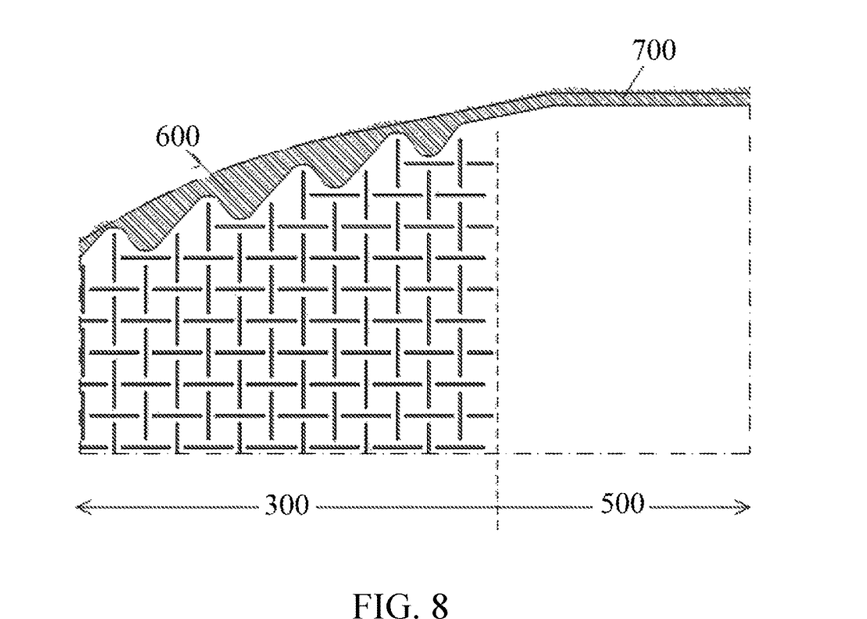
FIG. 8 is a second enlarged view of an OLED display device according to an embodiment of the present disclosure.

FIG. 7 is a second schematic diagram of a structure of an OLED display device according to an embodiment of the present disclosure. FIG. 8 is a second enlarged view of an OLED display device according to an embodiment of the present disclosure. By way of example, FIG. 8 is regarded as an enlarged view for a position at c in FIG. 7. In an exemplary embodiment, as shown in FIG. 7 and FIG. 8, at least a part of the edge of the frame region 500 at a side away from the flat region 100 is provided with a second etching region 700. In the direction perpendicular to the OLED display device, the second etching region 700 is a region where the second display film layer 60 is etched away and the second etching region 700 can improve the stretchability and reliability of the edge of the frame region 500.

In an exemplary embodiment, the second etching region 700 is connected with the entire edge of the frame region 500 at the side away from the flat region 100, the first etching region 600 is connected with the entire edge of the display region 400 at the side away from the flat region 100, and the second etching region 700 is connected with the first etching region 600 end to end to form an annular region around the perimeter of the bent region 200.

Figure 9:
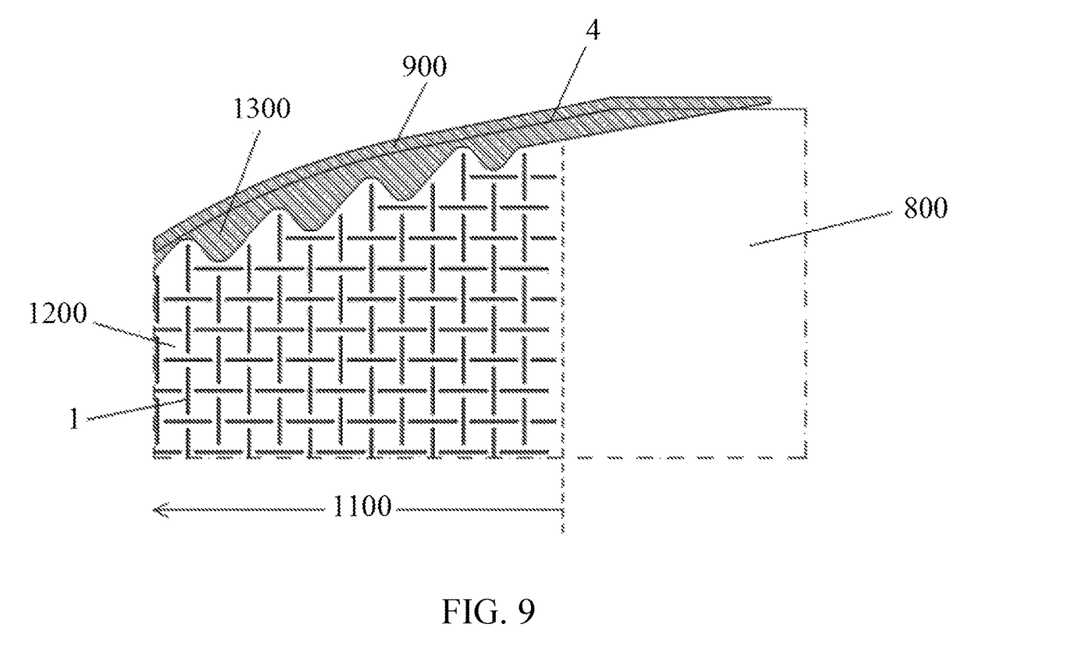
FIG. 9 is a schematic diagram of a structure of an intermediate display motherboard according to an embodiment of the present disclosure.

FIG. 9 is a schematic diagram of a structure of an intermediate display motherboard according to an embodiment of the present disclosure. As shown in FIG. 9, an intermediate display motherboard according to an embodiment of the present disclosure includes at least one OLED display device to be cut 800 and a peripheral region around the OLED display device to be cut 800, the at least one OLED display device to be cut 800 includes at least one stretchable region 1100. Taking the OLED display device to be cut 800 as a rectangle with rounded corners as an example, the stretchable region 1100 is a rectangular ring with rounded corners. The OLED display device to be cut 800 includes four stretchable regions 1100 located at four corner positions of the OLED display device to be cut 800 respectively. The stretchable region 1100 includes a displayable region 1200 and a third etching region 1300, wherein the third etching region 1300 is located at an edge of the displayable region 1200 at a side close to an peripheral region, and the third etching region 1300 is connected with at least a part of the edge of the displayable region 1200 at a side close to the peripheral region, the displayable region 1200 includes at least one opening 1, and a boundary between the third etching region 1300 and the displayable region 1200 bypasses the opening 1; the peripheral region includes a fourth etching region 900 connected with the third etching region 1300, and a boundary between the fourth etching region 900 and the third etching region 1300 forms a cutting line 4. The displayable region 1200 includes a first base substrate and a first structure film layer stacked on the first base substrate, and the third etching region 1300 is a region where the first base substrate and the first structure film layer are etched away. The peripheral region includes a second base substrate and a second structure film layer stacked on the second base substrate, and the fourth etching region 900 is a region where the second base substrate and the second structure film layer are etched away.

In an exemplary embodiment, the cutting line 4 is a laser cutting line, and a minimum distance from the boundary between the third etching region 1300 and the displayable region 1200 to the cutting line 4 is greater than the sum of the laser cutting accuracy tolerance and the heat affected region of laser cutting; and/or, the minimum distance from an edge of the fourth etching region 900 at a side away from the third etching region 1300 to the cutting line 4 is greater than the sum of the laser cutting accuracy tolerance and the heat affected region of laser cutting, thereby preventing the laser from affecting the opening 1 on the OLED display device to be cut 800 during cutting.

In the cutting process of the intermediate display motherboard according to an embodiment of the present disclosure, a base substrate and a structure film layer stacked on the base substrate are formed at first; in the process of forming the base substrate and the structure film layer, the base substrate and the structure film layer at the opening, the third etching region and the fourth etching region of the OLED display device to be cut are etched away through a photolithography process, such that the boundary between the third etching region and the displayable region bypasses the opening to ensure the integrity of the opening. Then, the boundary between the fourth etching region and the third etching region forms a cutting line, such that the cutting line bypasses the opening of the OLED display device to be cut, and an enough cutting space is reserved for laser cutting, so as to avoid damage to the opening of the OLED display device to be cut caused by laser cutting, and improve the stretching performance and reliability of the OLED display device.

A preparation method of an OLED display device is provided, the method includes:

forming a flat region and a bent region around the flat region; wherein, the bent region is bent toward a backlight side of the flat region, and the bent region includes at least one stretching region; the stretching region includes a display region and a first etching region, the first etching region is located at an edge of the display region at a side away from the flat region, the first etching region is connected with at least a part of the edge of the display region at the side away from the flat region; the display region includes at least one opening, and a boundary of the first etching region and the display region bypasses the opening; the display region includes a first display film layer, and the first etching region is a region where the first display film layer is etched away.

In an exemplary embodiment, the first etching region and the opening are prepared by a same etching process.

In an exemplary embodiment, the boundary between the first etching region and the display region is formed with a plurality of concave portions and a plurality of convex portions arranged alternately.

In an exemplary embodiment, the display region is formed with at least two openings in such a way that the concave portion bypasses the openings, and the convex portion is positioned between adjacent openings.

The drawings of the present disclosure only involve structures involved in the present disclosure, and other structures may refer to conventional designs. The embodiments in the present disclosure, i.e., features in the embodiments, may be combined with each other to obtain new embodiments if there is no conflict.

Those of ordinary skills in the art should understand that modifications or equivalent replacements may be made to the technical solutions of the present disclosure without departing from the spirit and scope of the technical solutions of the present disclosure, and all those modifications or equivalent replacements shall fall into the scope of the claims of the present disclosure.

The invention claimed is:

1. An OLED display device, comprising a flat region and a bent region around the flat region; wherein
    the bent region is bent toward a backlight side of the flat region, and the bent region comprises at least one stretching region;
    the stretching region comprises a display region and a first etching region, wherein the first etching region is located at an edge of the display region at a side away from the flat region, and the first etching region is connected with at least a part of the edge of the display region at the side away from the flat region;
    the display region comprises at least one opening, and a boundary between the first etching region and the display region bypasses the opening;
    the display region comprises a first display film layer, and the first etching region is a region where the first display film layer is etched away.

2. The OLED display device according to claim 1, wherein the boundary between the first etching region and the display region comprises a plurality of concave portions and a plurality of convex portions arranged alternately.

3. The OLED display device according to claim 2, wherein the display region comprises at least two openings, the concave portions bypass the openings, and the convex portions are located between adjacent openings.

4. The OLED display device according to claim 3, wherein the at least two openings comprise at least two first slits, and the at least two first slits extend along a first direction and are arranged at intervals along a second direction, and the first direction is different from the second direction, the concave portions bypass ends of the at least two first slits, and the convex portions are located between adjacent at least two first slits.

5. The OLED display device according to claim 3, wherein the display region comprises at least three openings, and the at least three opening comprise at least two first slits and at least one second slit, wherein the at least two first slits extend along a first direction and are arranged at intervals along a second direction, the at least one second slit extends along the second direction, and the first direction is different from the second direction, the at least one second slit is located between adjacent at least two first slits and at least one groove is formed by the at least one second slit in combination with the at least two first slits, the concave portions bypass ends of the at least two first slits, and the convex portions are located in the at least one groove.

6. The OLED display device according to claim 3, wherein a minimum distance between the boundary and an edge of an opening is equal to a minimum distance between edges of adjacent openings.

7. The OLED display device according to claim 3, wherein corners of the concave portions and/or the convex portions are rounded corners.

8. The OLED display device according to claim 7, wherein a radius of a rounded corner equals to 3 to 10 times a width of an opening.

9. The OLED display device according to claim 1, wherein the opening is a rectangle with rounded corners.

10. The OLED display device according to claim 1, wherein the first etching region comprises a functional structure film layer that wraps an edge of the first display film layer.

11. The OLED display device according to claim 10, wherein the functional structure film layer comprises a first functional film layer and a second functional film layer provided oppositely, and a connection layer provided between the first functional film layer and the second functional film layer, and the connection layer wraps the edge of the first display film layer.

12. The OLED display device according to claim 1, wherein the first display film layer comprises a base substrate, and the base substrate comprises a first flexible substrate layer, a first buffer layer, a second flexible substrate layer and a second buffer layer, which are stacked, wherein the first flexible substrate layer and the second flexible substrate layer are made of organic material, the first buffer layer and the second buffer layer are made of inorganic material, and edges of the first flexible substrate layer and the second flexible substrate layer at a side close to the first etching region are recessed along a direction away from the first etching region.

13. The OLED display device according to claim 1, wherein the etching region is connected with an entire edge of the display region at the side away from the flat region.

14. The OLED display device according to claim 1, wherein the bent region further comprises at least one frame region connected with the stretching region, at least a part of the edge of the frame region at the side away from the flat region is provided with a second etching region, the frame region comprises a second display film layer, and the second etching region is a region where the second display film layer is etched away.

15. A preparation method of an OLED display device, comprising:

forming a flat region and a bent region around the flat region; wherein, the bent region is bent toward a backlight side of the flat region, and the bent region comprises at least one stretching region; the stretching region comprises a display region and a first etching region, the first etching region is located at an edge of the display region at a side away from the flat region, the first etching region is connected with at least a part of the edge of the display region at the side away from the flat region; the display region comprises at least one opening, and a boundary between the first etching region and the display region bypasses the opening; the display region comprises a first display film layer, and the first etching region is a region where the first display film layer is etched away.

16. The preparation method of an OLED display device according to claim 15, wherein the first etching region and the opening are prepared by a same etching process.

17. The preparation method of an OLED display device according to claim 15, wherein the boundary between the first etching region and the display region is formed with a plurality of concave portions and a plurality of convex portions arranged alternately.

18. The preparation method of the OLED display device according to claim 17, wherein the display region is formed with at least two openings in such a way that the concave portions bypass the openings, and the convex portions are positioned between adjacent openings.

* * * * *